(12) United States Patent
Lee et al.

(10) Patent No.: US 9,754,806 B2
(45) Date of Patent: *Sep. 5, 2017

(54) APPARATUS FOR TREATING WAFERS USING SUPERCRITICAL FLUID

(71) Applicant: Samsung Electronics Co., Ltd., Suwon-si, Gyeonggi-do (KR)

(72) Inventors: Hyo-San Lee, Suwon-si (KR);
Chang-ki Hong, Seongnam-si (KR);
Kun-tack Lee, Suwon-si (KR);
Jeong-nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 364 days.

This patent is subject to a terminal disclaimer.

(21) Appl. No.: 14/580,513

(22) Filed: Dec. 23, 2014

(65) Prior Publication Data

US 2015/0162221 A1    Jun. 11, 2015

Related U.S. Application Data

(63) Continuation of application No. 12/973,963, filed on Dec. 21, 2010, now Pat. No. 8,951,383, which is a
(Continued)

(30) Foreign Application Priority Data

Aug. 7, 2006    (KR) .................. 10-2006-0074316

(51) Int. Cl.
*H01L 21/67*    (2006.01)
*H01J 37/32*    (2006.01)

(52) U.S. Cl.
CPC .. *H01L 21/67017* (2013.01); *H01J 37/32449* (2013.01); *H01J 37/32467* (2013.01);
(Continued)

(58) Field of Classification Search
None
See application file for complete search history.

(56) References Cited

U.S. PATENT DOCUMENTS 6,286,231 B1    9/2001    Bergman et al.
6,949,143 B1 *  9/2005    Kurita .................. B65G 49/068
                                                        118/719

(Continued)

FOREIGN PATENT DOCUMENTS

JP    2004-249219    9/2004
JP    2004-249220    9/2004
(Continued)

*Primary Examiner* — Sylvia R Macarthur
(74) *Attorney, Agent, or Firm* — Myers Bigel, P.A.

(57) ABSTRACT

Provided are an apparatus and method for treating wafers using a supercritical fluid. The wafer treatment apparatus includes a plurality of chambers; a first supply supplying a first fluid in a supercritical state; a second supply supplying a mixture of the first fluid and a second fluid; a plurality of first and second valves; and a controller selecting a first chamber of the plurality of chambers for wafer treatment to control the open/closed state of each of the plurality of first valves so that the first fluid can be supplied only to the first chamber of the plurality of chambers and selecting a second chamber of the plurality of chambers to control the open/closed state of each of the plurality of second valves so that the mixture of the first fluid and a second fluid can be supplied only to the second chamber of the plurality of chambers. The wafer treatment method involves performing a predetermined treatment such as etching, cleaning or drying on wafers within only one of the plurality of chambers, followed by wafer treatment on the succeeding chamber, and thus allowing for sequential wafer treatment within each of the plurality of chambers.

19 Claims, 6 Drawing Sheets

Related U.S. Application Data continuation of application No. 11/725,829, filed on Mar. 20, 2007, now Pat. No. 7,857,939.

(52) U.S. Cl.
CPC .. *H01J 37/32715* (2013.01); *H01J 37/32743* (2013.01); *H01J 37/32816* (2013.01); *H01L 21/67028* (2013.01); *H01L 21/67069* (2013.01); *H01L 21/67276* (2013.01); *H01J 2237/334* (2013.01); *H01J 2237/335* (2013.01); *Y10T 137/2931* (2015.04); *Y10T 137/4673* (2015.04)

(56) References Cited

U.S. PATENT DOCUMENTS

| | | | |
|---|---|---|---|
| 7,000,621 | B1 | 2/2006 | Verhaverbeke |
| 7,857,939 | B2* | 12/2010 | Lee ............... H01L 21/67028 118/729 |
| 8,951,383 | B2* | 2/2015 | Lee ............... H01L 21/67028 156/345.15 |
| 2006/0065287 | A1 | 3/2006 | Kroeker |
| 2006/0135047 | A1* | 6/2006 | Sheydayi ......... H01L 21/67057 451/41 |
| 2011/0083807 | A1 | 4/2011 | Lee et al. |
| 2015/0162221 | A1* | 6/2015 | Lee ............... H01L 21/67028 156/345.26 |

FOREIGN PATENT DOCUMENTS

| | | |
|---|---|---|
| KR | 10-2005-0032943 A | 4/2005 |
| WO | WO 03/030219 A3 | 4/2003 |

\* cited by examiner

APPARATUS FOR TREATING WAFERS USING SUPERCRITICAL FLUID

CROSS-REFERENCE TO RELATED PATENT APPLICATIONS

This application is a continuation application of U.S. patent application Ser. No. 12/973,963, filed Dec. 21, 2010, which is a continuation application of U.S. patent application Ser. No. 11/725,829, filed Mar. 20, 2007, now U.S. Pat. No. 7,857,939, which claims the benefit of Korean Patent Application No. 10-2006-0074316, filed Aug. 7, 2006, in the Korean Intellectual Property Office, the disclosures of which are hereby incorporated herein by reference in their entireties.

FIELD OF THE INVENTION

The present invention relates generally to semiconductor devices and, more particularly, to apparatus and methods for fabricating semiconductor devices.

BACKGROUND OF INVENTION

As the design rules of semiconductor devices change, it has become increasingly necessary to form deeper, narrower contacts with higher aspect ratios. The formation of a deep, narrow contact with a high aspect ratio involves an etching or cleaning step. When treating a wafer on which a high aspect ratio structure is formed by etching, cleaning, or drying the wafer, defects may frequently occur due to damage to other layers of the wafer and/or water spots on a wafer surface when a conventional wet etching process is utilized. Furthermore, when a wet etching process is performed to remove a mold oxide layer, which is used as a sacrificial layer when forming a storage node for a capacitor, the storage node of the capacitor tends to lean or collapse after the removal of the mold oxide layer due to the high surface tension of pure water.

To solve the above-mentioned problems, etching, cleaning, and/or drying a predetermined layer on a wafer using a supercritical $CO_2$ solvent have been proposed. Unfortunately, conventional methods for treating wafers using supercritical $CO_2$ solvent may allow only one wafer to be treated at a time in order to maintain a high temperature, a high pressure supercritical state. As such, the use of supercritical $CO_2$ processing may cause reduced process throughput.

SUMMARY OF THE INVENTION

The present invention provides apparatus for treating wafers using a supercritical fluid that can offer improved uniformity between wafers as well as improved process throughput by reducing unnecessary loss of time when a large number of wafers are treated.

The present invention also provides methods of treating wafers using a supercritical fluid that can offer improved uniformity between wafers as well as improved process throughput by reducing unnecessary loss of time when a large number of wafers are treated.

According to an embodiment of the present invention, there is provided a wafer treatment apparatus including: a wafer treating unit including a plurality of chambers; a fluid supply unit including a first supply that supplies a first fluid in a supercritical state to the wafer treating unit and a second supply that supplies a mixture of the first fluid and a second fluid to the wafer treating unit; a plurality of first supply lines, each of which is connected between the first supply and one of the plurality of chambers and feeds the first fluid supplied from the first supply into the plurality of chambers; a plurality of second supply lines, each of which is connected between the second supply and one of the plurality of chambers and supplies the mixture supplied from the second supply to the plurality of chambers; a plurality of first valves that are disposed on the corresponding plurality of first supply lines and allows or blocks the supply of the first fluid through the plurality of first supply lines; a plurality of second valves that are disposed on the corresponding plurality of second supply lines and allows or blocks the supply of the mixture supplied from the second supply through the plurality of second supply lines; and a controller that selects a first chamber of the plurality of chambers for wafer treatment in order to control the open/closed state of each of the plurality of first valves so that the first fluid can be supplied only to the first chamber of the plurality of chambers and that selects a second chamber of the plurality of chambers in order to control the open/closed state of each of the plurality of second valves so that the mixture supplied from the second supply can be supplied only to the second chamber of the plurality of chambers.

The first fluid may be composed of super-critical $CO_2$. The second fluid may be composed of an alcohol-based cosolvent, fluorine-containing compound, or a mixture thereof.

The wafer treatment apparatus may further include a plurality of timers that are disposed near the corresponding plurality of chambers and control the time for wafer treatment within the chambers.

The apparatus may further include a plurality of pressure adjusting elements that are disposed near the corresponding plurality of chambers and control the pressure within the chambers and the pressure in the first and second supply lines. Each of the plurality of chambers includes a pair of cases mutually fitted to open and close in order to define a treatment space for treating wafers and a plurality of chucks that are fixed to the pair of cases that support the wafers within the treatment space.

The first supply may include a first bombe supplying the first fluid in a liquid state at a first pressure and a condenser compressing the first fluid supplied from the first bombe at a second pressure higher than the first pressure to create a supercritical fluid. The first supply may further include a booster pump that is disposed between the condenser and the wafer treating unit and that increases the pressure of the first fluid escaping from the condenser.

The apparatus may further include a separator separating a supercritical fluid from a fluid escaping from each of the chambers in the wafer treating unit and a recycle filter filtering out the supercritical fluid obtained by the separator and feeding the supercritical fluid back to the first supply.

The controller can control the open/closed state of the plurality of first and second valves so as to enable simultaneous supply of the first fluid and the mixture supplied from the second supply to the first and second chambers of the plurality of chambers, respectively.

According to another embodiment of the present invention, there is provided a wafer treatment method including operations of: preparing a plurality of chambers connected to first supply lines that supply a first fluid in a supercritical state and second supply lines that supply a mixture of the first fluid and a second fluid; loading a pair of wafers into a first chamber of the plurality of chambers so that the pair of wafers are spaced apart by a predetermined distance corresponding to a treatment space, with the front sides of the pair of wafers facing each other; performing a first pretreatment on the pair of wafers by supplying the first fluid fed through the first supply line to the treatment space within the first chamber; performing a first treatment on the pair of wafers by supplying the mixture fed through the second supply line to the treatment space within the first chamber; and unloading the wafers from the first chamber of the plurality of chambers.

The wafer treatment method may further include operations of: loading the pair of wafers into a second chamber of the plurality of chambers so that the pair of wafers are spaced apart by a predetermined distance corresponding to the treatment space within the second chamber, with the front sides of the pair of wafers facing each other; performing a second wafer treatment on the pair of wafers within the second chamber of the plurality of chambers by supplying the mixture fed through the second supply line to the treatment space within the second chamber of the plurality of chambers simultaneously with the first unloading, following the first wafer treatment; and unloading the pair of wafers from the second chamber of the plurality of chambers.

The method may further include operations of: loading a pair of wafers into a third chamber of the plurality of chambers so that the pair of wafers are spaced apart by a predetermined distance corresponding to a treatment space within the third chamber, with the front sides of the pair of wafers facing each other; performing a third treatment on the wafers within the third chamber of the plurality of chambers by supplying the mixture fed through the second supply line to the treatment space within the third chamber simultaneously with the second unloading, following the second wafer treatment; and unloading the wafers from the third chamber of the plurality of chambers.

The method may further include operations of: after unloading of the wafers from the first chamber, loading two wafers into the first chamber so that the two wafers are spaced apart by a predetermined distance corresponding to a treatment space, with the front sides facing each other, wherein the number of chambers is a natural number N greater than or equal to 3; and when predetermined treatment is performed on wafers within all of the N chambers, performing an N+1-st treatment on the two wafers within the first chamber, immediately following a predetermined treatment on wafers within an N-th chamber that is the last one of the N chambers. The method may further include the operation of, before performing the N+1st treatment, performing an N+1st pretreatment on the pair of wafers by supplying the first fluid fed through the first supply line to the treatment space within the first chamber at the same time as the predetermined treatment on the pair of wafers within the N-th chamber of the plurality of chambers. The wafer treatment method of the present invention also allows simultaneous treatment of at least two wafers loaded into a single chamber, thus increasing process throughput.

Thus, the present invention can reduce the amount of time required to treat a plurality of wafers using a supercritical fluid, thus increasing productivity. The present invention also enables sequential wafer treatment within each of a plurality of chambers, thus improving uniformity across treated wafers.

BRIEF DESCRIPTION OF THE DRAWINGS

The above and other features and advantages of the present invention will become more apparent by describing in detail exemplary embodiments thereof with the attached drawings in which.

DETAILED DESCRIPTION OF THE INVENTION

The present invention will now be described more fully with reference to the accompanying drawings, in which embodiments of the invention are shown.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
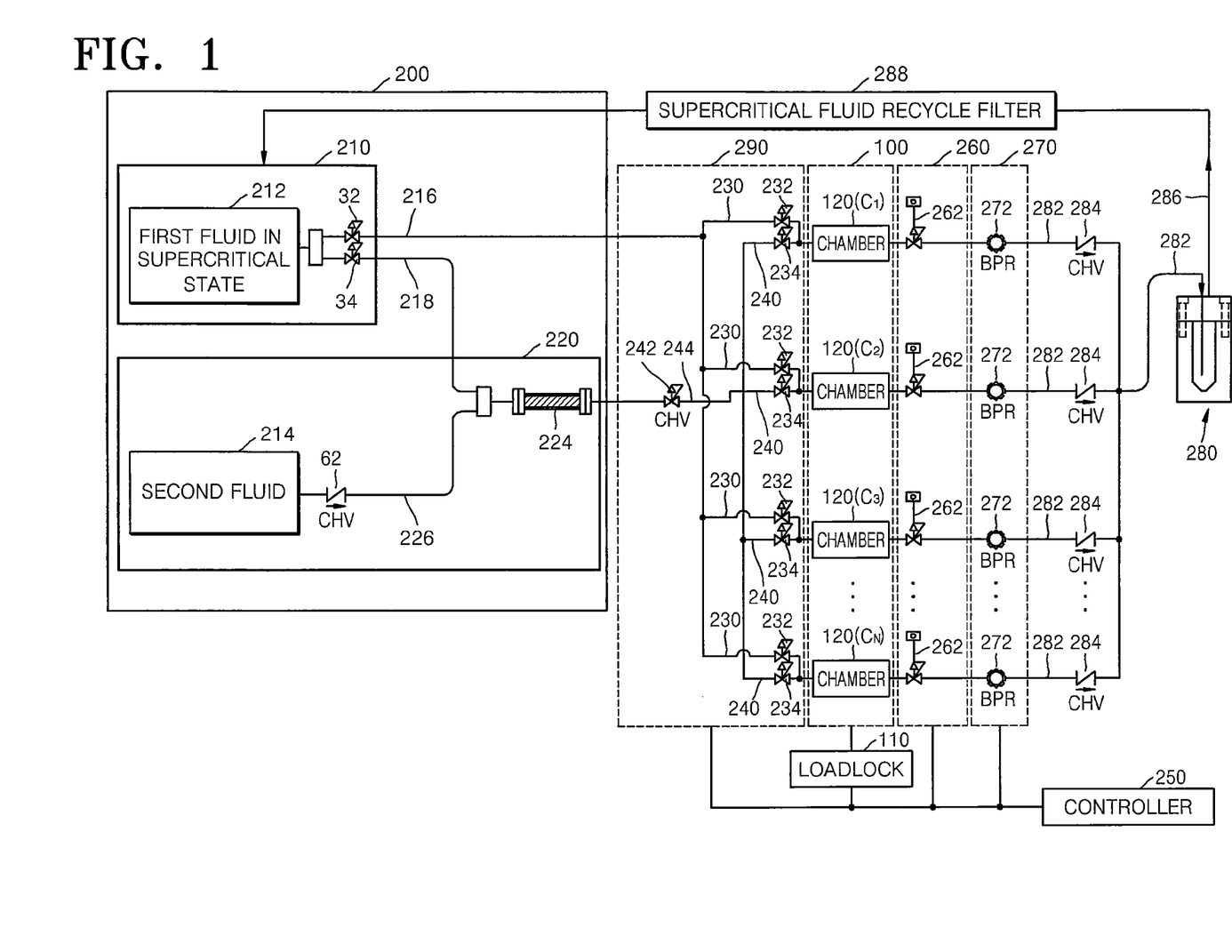
FIG. 1 is a schematic diagram illustrating the main components of a wafer treatment apparatus according to an embodiment of the present invention.

FIG. 1 is a schematic diagram illustrating the main components of a wafer treatment apparatus according to an embodiment of the present invention.

Referring to FIG. 1, the wafer treating apparatus includes a wafer treating unit 100 having a plurality of chambers 120 $C_1$ through $C_N$ (N is a natural number) and a fluid supply unit 200 that supplies fluids, which are required for performing a predetermined treatment such as etching, cleaning or drying on a wafer, to each of the chambers 120 $C_1$ through $C_N$. The fluid supply unit 200 includes a first supply 210 that supplies a first fluid 212 in a supercritical state to the wafer treating unit 100 and a second supply 220 that supplies a mixture of the first fluid 212 and a second fluid 214 to the wafer treating unit 100. The second supply 220 includes a mixing tank 224 that mixes the first fluid 212 with the second fluid 214.

The first fluid 212 may be composed of, for example, supercritical $CO_2$. The second fluid 214 may be composed of, for example, an alcohol-based cosolvent, a fluorine-containing compound, or a mixture thereof.

A process that involves etching a predetermined layer on a wafer may be performed within each of the chambers 120 $C_1$ through $C_N$ in the wafer treating unit 100. According to embodiments of the present invention, when the predetermined layer is an oxide layer, the second fluid 214 may contain a mixture of fluorine-containing compound and pyridine. Alternatively, the second fluid 214 may contain at least one material selected from the group consisting of sodium bis (2,2,3,3,4,4,5, 5-octafluoro-1-pentyl)-2-sulfosuccinate (F-AOT), fluorine-based surfactant, and alcohol-based cosolvent. For example, the alcohol-based cosolvent may be methanol, ethanol, isopropyl alcohol (IPA), or propanol.

The process performed within each of the chambers 120 $C_1$ through $C_N$ may include the operation of etching a predetermined layer on a wafer and a cleaning step for removing a product remaining on a wafer after the etching step. The process may only include the operation of cleaning a wafer surface. According to embodiments of the present invention, the cleaning step may be performed using a mixture of the first fluid 212 composed of supercritical $CO_2$ and the second fluid 214, which is composed of a cosolvent.

Materials contained in the first and second fluid 214 may vary depending on the type of a layer on a wafer that is to be etched or cleaned.

The illustrated wafer treatment apparatus further includes a plurality of first supply lines 230, each of which is disposed between the first supply 210 and one of the plurality of chambers 120 $C_1$ through $C_N$ and feeds the first fluid 212 supplied from the first supply 210 into the plurality of chambers 120 $C_1$ through $C_N$.

The first fluid 212 that is supplied from the first supply 210 can be fed into the plurality of chambers 120 $C_1$ through $C_N$ through a first branch line 216 and the plurality of supply lines 230. The supply of the first fluid 212 to the plurality of chambers 120 $C_1$ through $C_N$ may be allowed or blocked by opening or closing a plurality of first valves 232 corresponding to the plurality of first supply lines 230, as illustrated.

The first fluid 212 is supplied from the first supply 210 to the mixing tank 224 through a second branch line 218. The mixing tank 224 mixes the first fluid 212 supplied from the first supply 210 with the second fluid 214 supplied through a supply line 226. The wafer treatment apparatus further includes a plurality of second supply lines 240, each of which is disposed between the second supply 220 and one of the plurality of chambers 120 $C_1$ through $C_N$ and supplies a mixture of the first and second fluids 212 and 214 obtained from the mixing tank 224 to the plurality of chambers 120 $C_1$ through $C_N$. The supply of the mixture of the first and second fluids 212 and 214 to the plurality of chambers 120 $C_1$ through $C_N$ may be allowed or blocked by opening or closing a check valve 242 installed on a supply line 244 and a plurality of second valves 234, each of which is installed on one of the plurality of first supply lines 240, as illustrated.

A treatment time controller 260 is disposed behind the wafer treating unit 100 and includes a plurality of timers 262 that control the time of wafer treatment within the plurality of chambers 120 $C_1$ through $C_N$. A pressure adjusting unit 270 is disposed behind the plurality of chambers 120 $C_1$ through $C_N$ and includes a plurality of pressure regulators 272 that control the pressure within the plurality of chambers 120 $C_1$ through $C_N$ and the pressure in a part of the wafer treatment apparatus disposed in front of the wafer treating unit 100 and, in particular, in the plurality of first and second supply lines 230 and 240.

In order to perform a predetermined wafer treatment for a selected one of the plurality of chambers 120 $C_1$ through $C_N$ in the wafer treating unit 100, a fluid may be allowed to flow only into the selected chamber 120 of the plurality of chambers 120 $C_1$ through $C_N$ by controlling the open/closed state of each of the plurality of first and second valves 232 and 234 and the check valve 242. A controller 250 may control the open/closed state of each valve of the supply line valve unit 290 including the plurality of first valves 232, the plurality of second valves 234, and the check valve 242. That is, the controller 250 can control the open/closed state of each of the plurality of first and second valves 232 and 234 and the check valve 242 in the supply line valve unit 290 so that the first fluid 212 or the mixture of the first and second fluids 212 and 214 can be fed into the selected chamber 120 of the plurality of chambers 120 $C_1$ through $C_N$. Alternatively, the controller 250 can select a chamber 120 from the plurality of chambers 120 $C_1$ through $C_N$ other than the chamber 120 receiving the first fluid 212 and control the open/closed state of each of the first and second valves 232 and 234 and the check valve 242 so that a mixture of the first and second fluids 212 and 214 can be supplied to the selected chamber 120 of the plurality of chambers 120 $C_1$ through $C_N$.

The controller 250 may also control the open/closed state of each of the plurality of first and second valves 232 and 234 and the check valve 242 in the supply line valve unit 290 so that the first fluid 212 is fed into one of the plurality of chambers 120 $C_1$ through $C_N$ at the same time that a mixture of the first and second fluids 212 and 214 is supplied to another one of the plurality of chambers 120 $C_1$ through $C_N$.

The controller 250 also delivers a predetermined control signal to the wafer treating unit 100 and a loadlock 110 that is near the wafer treating unit 100 to control the carriage of wafers between a selected chamber 120 of the plurality of chambers 120 $C_1$ through $C_N$ and the loadlock 110, i.e., loading/unloading of a wafer into/from the selected chamber 120 of the plurality of chambers 120 $C_1$ through $C_N$. In this case, wafer treatment can be performed within only the selected chamber 120 of the plurality of chambers 120 $C_1$ through $C_N$. The controller 250 may control the open/closed state of each valve in the supply line valve unit 290 and the loading/unloading of wafers into/from each of the plurality of chambers 120 $C_1$ through $C_N$ so that all of the plurality of chambers 120 $C_1$ through $C_N$ can be sequentially used for wafer treatment by sequentially performing wafer treatment in each of the plurality of chambers 120 $C_1$ through $C_N$ until the desired treatment is performed on all the wafers.

After completing the predetermined wafer treatment within the selected chamber 120 of the plurality of chambers 120 $C_1$ through $C_N$ in the wafer treating unit 100, a residual fluid in the chambers 120 is discharged into a separator 280 via an exhaust line 282 disposed at the downstream of the wafer treating unit 100. A check valve 284 is installed on the exhaust line 282 and controls the flow of fluid through the exhaust line 282.

The separator 280 acts to neutralize a fluid discharged from each of the plurality of chambers 120 $C_1$ through $C_N$ in the wafer treating unit 100. For example, when hydrogen fluoride (HF) escapes from the chambers 120, a 1M aqueous NaOH solution may be accommodated within the separator 280 to neutralize the acidity. That is, if an acid fluid escapes from the plurality of chambers 120 $C_1$ through $C_N$, an alkaline solution is provided within the separator 280. Conversely, if an alkaline fluid escapes from the plurality of chambers 120 $C_1$ through $C_N$, an acid solution is provided within the separator 280.

The separator 280 also separates a supercritical fluid such as supercritical $CO_2$ from a fluid discharged from each of the plurality of chambers 120 $C_1$ through $C_N$, receives the supercritical fluid through a supercritical fluid recycle filter 288, and feeds the received supercritical fluid back into a bombe (not shown) in the first supply 210 holding the material of the supercritical fluid.

The supply line valve unit 290 may further include a booster pump (not shown) that increases the pressure of a fluid being supplied through the first branch line 216 or the supply line 244 corresponding to the pressure that can be actually applied in the wafer treating unit 100 before the fluid reaches the wafer treating unit 100.

Figure 2:
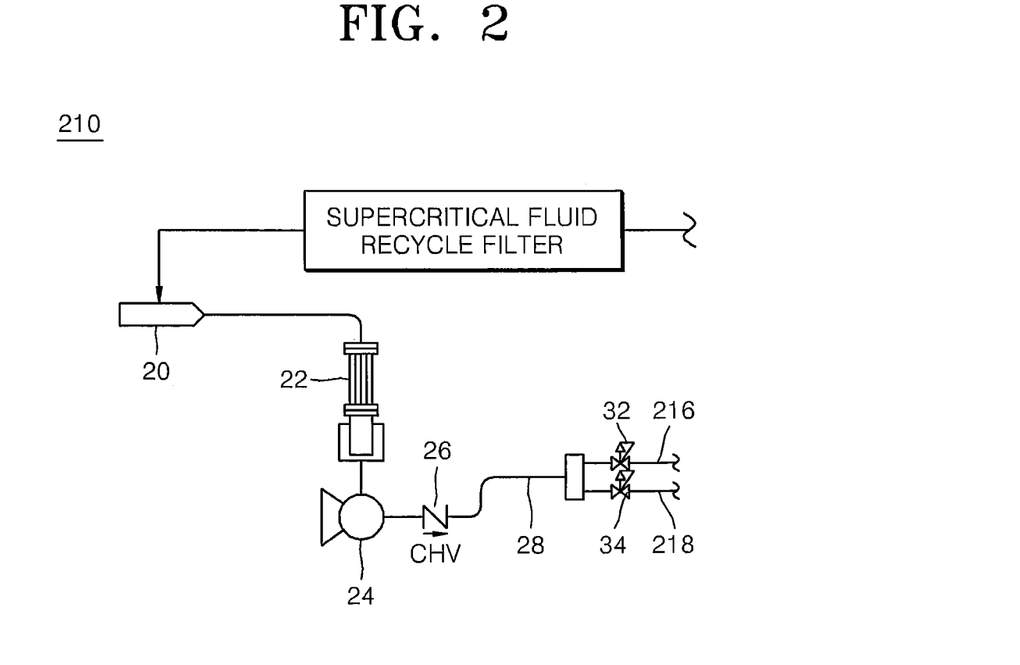
FIG. 2 illustrates the detailed configuration of a first supply of the wafer treatment apparatus illustrated in FIG. 1, according to an embodiment of the present invention.

FIG. 2 illustrates the detailed configuration of the first supply 210 of the wafer treatment apparatus illustrated in FIG. 1, according to an embodiment of the present invention.

Referring to FIG. 2, the first supply 210 of the wafer treatment apparatus includes a bombe 20 containing the material of the first fluid 212 such as $CO_2$. The $CO_2$ stored in the bombe 20 is supplied to a condenser 22 as a liquid at a pressure of about 800 psi. The condenser 22 compresses the material supplied from the bombe 20 at a higher pressure than 800 psi to create a supercritical fluid. The supercritical fluid that escapes from the condenser 22 becomes the first fluid 212 in a supercritical state having a higher pressure of about 2,000 to 3,500 psi as it passes through a booster pump 24. The first fluid 212 is transferred to the first or second branch line 216 or 218 according to the opening/closing operations of valves 26, 32, and 34 respectively mounted on a supply line 28 disposed behind the booster pump 24 and the first and second branch lines 216 and 218.

Although not shown, the first supply 210 may further include a cooling jacket and a temperature regulating cooler installed between the bombe 20 and the condenser 22. The cooling jacket maintains the temperature of the material of the supercritical fluid supplied from the bombe 20 at a desired level. The temperature regulating cooler controls the temperatures of materials set within the cooling jacket and the condenser 22. The first supply 210 may further include a heating band (not shown) that covers a fluid flowing through the second branch line 218 and the supply lines 226 and 244 to maintain the temperature of the fluid flowing through the second branch line 218 and the supply lines 226 and 244 at an appropriate level, e.g., within a range of about 40 to 60° C.

Figure 3:
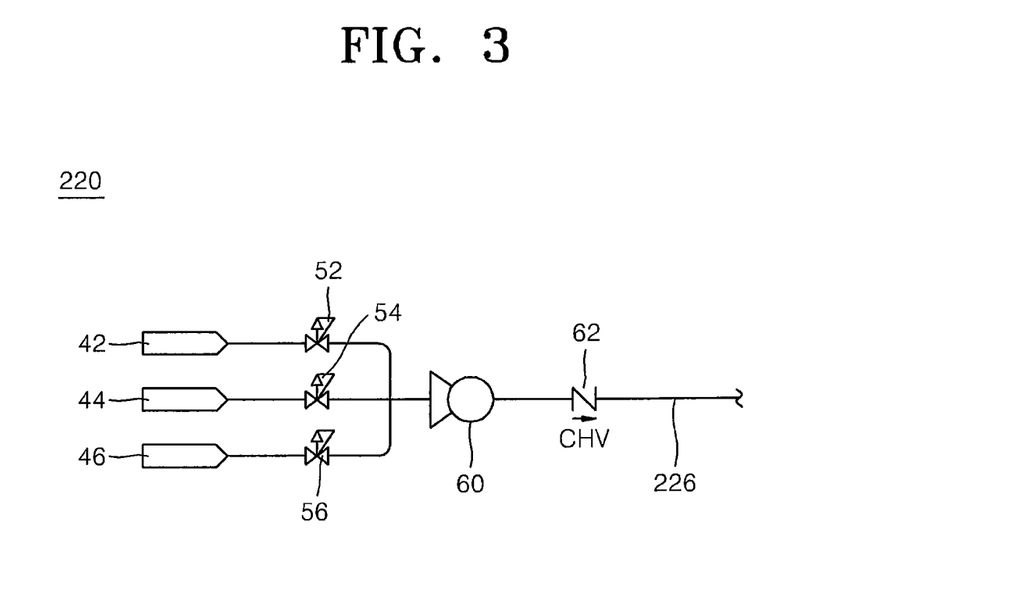
FIG. 3 illustrates a second supply of the wafer treatment apparatus illustrated in FIG. 1 that supplies a second fluid, according to an embodiment of the present invention.

FIG. 3 illustrates the second supply 220 of the wafer treatment apparatus illustrated in FIG. 1 that supplies the second fluid 214, according to an embodiment of the present invention;

Referring to FIG. 3, the second supply 220 of the wafer treatment apparatus includes a plurality of bombes 42, 44, and 46 supplying various kinds of medicines or solvents required to etch a predetermined layer on a wafer or clean a wafer surface. For example, each of the plurality of bombes 42, 44, and 46 may hold a fluorine-containing compound, surfactant, or alcohol-based solvent. The materials supplied from the plurality of the bombes 42, 44, and 46 can be selectively fed into one of the plurality of chambers 120 $C_1$ through $C_N$ via the supply line 226 according to the opening/closing operation of valves 52, 54, and 56. A booster pump 60 is mounted on the supply line 226 and increases the pressure of the materials received from the plurality of bombes 42, 44, and 46. A check valve 62 is installed on the supply line 226 and controls the operation of transferring the materials received from the plurality of bombes 42, 44, 46 into the wafer treating unit 100 according to an opening/closing operation of the check valve 62.

Figure 4A:
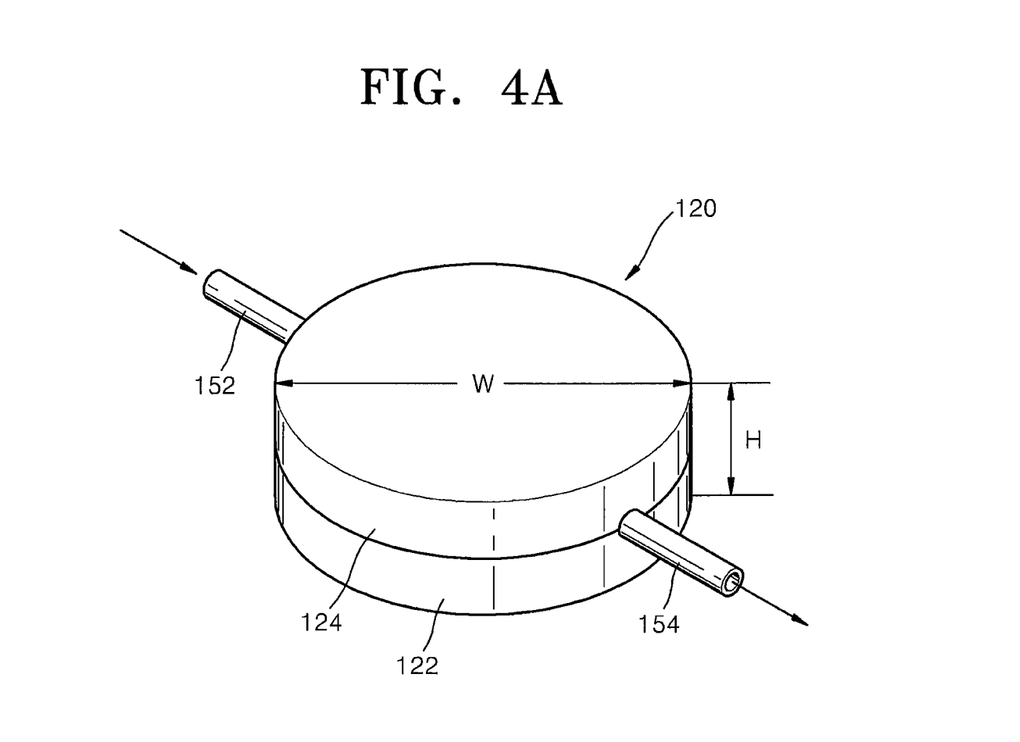
FIG. 4A is a perspective view illustrating a chamber of the wafer treatment apparatus illustrated FIG. 1, according to an embodiment of the present invention.
Figure 4B:
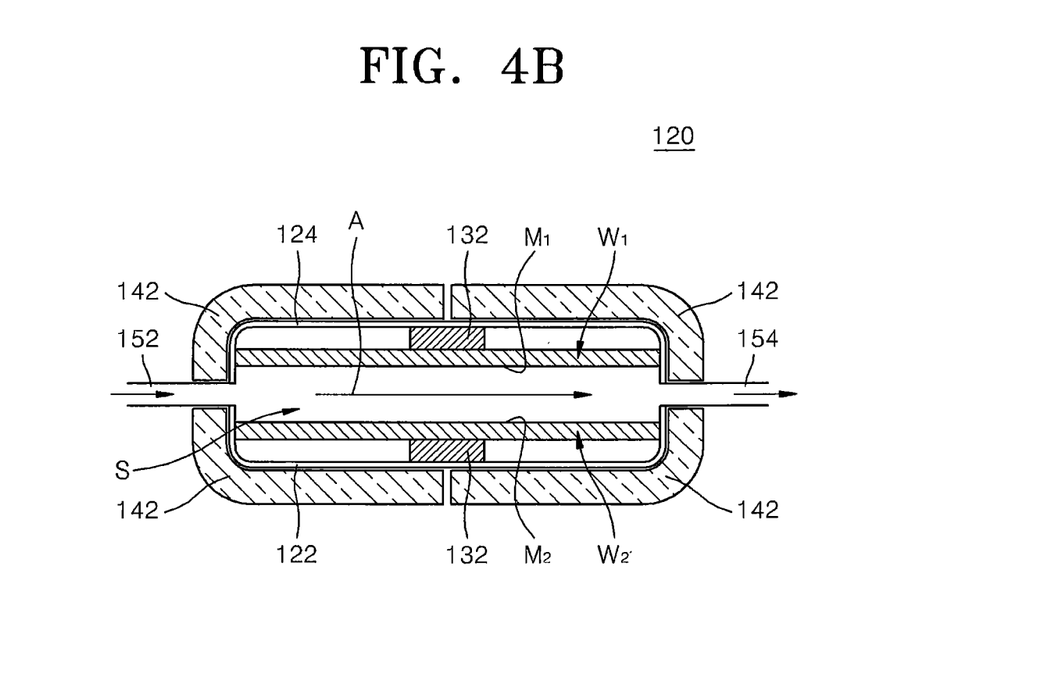
FIG. 4B is a longitudinally sectional view of the chamber of the wafer treatment apparatus illustrated in FIG. 4A, according to an embodiment of the present invention.

FIG. 4A is a perspective view illustrating one of the plurality of chambers 120 $C_1$ through $C_N$ of the wafer treatment apparatus illustrated in FIG. 1 and FIG. 4B is a longitudinally sectional view of one of the plurality of chambers 120 $C_1$ through $C_N$ of the wafer treatment apparatus illustrated FIG. 4A, according to an embodiment of the present invention.

Referring to FIGS. 4A and 4B, the plurality of chambers 120 $C_1$ through $C_N$ in the wafer treatment apparatus include a pair of cases 122 and 124 mutually fitted to open and close in order to define a treatment space S for treating wafers $W_1$ and $W_2$. The pair of cases 122 and 124 may be formed of an anti-corrosive material such as, for example, hastelloy or monel metal. The height H of the sealed chamber 120 defined by the pair of cases 122 and 124 that mutually fit with each other may be in a range of about 60 and 80 mm. The width W of the pair of cases 122 and 124 may be in a range of about 300 and 400 mm. The plurality of chambers 120 $C_1$ through $C_N$ further include a housing 142 that encapsulates the pair of cases 122 and 124 so as to achieve firm sealing when the pair of cases 122 and 124 mutually fit with each other to close the plurality of chambers 120 $C_1$ through $C_N$.

Each of the plurality of chambers 120 $C_1$ through $C_N$ further includes a plurality of chucks 132 that are fixed to the pair of cases 122 and 124 and hold the pair of wafers $W_1$ and $W_2$ within the treatment space S. FIG. 4B illustrates that each of the plurality of chambers 120 $C_1$ through $C_N$ includes a pair of chucks 132, each of which is fixed to one of the pair of cases 122 and 124, supporting both wafers $W_1$ and $W_2$ so as to face each other. However, three or more wafers can be loaded into the plurality of chambers 120 $C_1$ through $C_N$ and each of the plurality of chambers 120 $C_1$ through $C_N$ may have a number of chucks 132 corresponding to the number of wafers being loaded into the plurality of chambers 120 $C_1$ through $C_N$. The chucks 132 may be fixedly mounted or rotatably mounted on the pair of cases 122 and 124.

Both wafers $W_1$ and $W_2$ may each be held by the chucks 132 in such a manner that the front sides $M_1$ and $M_2$ of the wafers are in face-to-face spaced apart relationships, as illustrated. For example, both 300-mm wafers $W_1$ and $W_2$ may be held by the chucks 132 within the plurality of chambers 120 $C_1$ through $C_N$ so that both 300-mm wafers $W_1$ and $W_2$ are subjected to a predetermined treatment with the front sides of both 300-mm wafers $W_1$ and $W_2$ facing each other.

The first fluid 212 or a mixture of the first and second fluids 212 and 214 is introduced into the treatment space S through a fluid inlet port 152 and escapes through a fluid outlet port 154. That is, the fluid flows along a direction parallel to a direction that the main surfaces of both the wafers $W_1$ and $W_2$ extend, as illustrated in FIG. 4B. In the present embodiment, a predetermined treatment is performed on the front sides $M_1$ and $M_2$ of the wafers $W_1$ and $W_2$ using the first fluid 212 or the mixture of the first and second fluids 212 and 214.

When the plurality of chambers 120 $C_1$ through $C_N$ are installed in the wafer treating unit 100, both wafers $W_1$ and $W_2$ are horizontally loaded into the plurality of chambers 120 $C_1$ through $C_N$ as illustrated in FIG. 4B. Alternatively, both wafers $W_1$ and $W_2$ may be perpendicularly loaded into the plurality of chambers 120 $C_1$ through $C_N$, which is opposite to the direction illustrated in FIG. 4B.

In the wafer treatment apparatus according to an embodiment described above with reference to FIGS. 1, 2, 3, 4A, and 4B, a plurality of wafers, e.g., both wafers $W_1$ and $W_2$, are loaded into each of the plurality of chambers 120 $C_1$ through $C_N$. A supercritical fluid such as pure supercritical $CO_2$ of about 1,000 to 3,500 psi is then injected into the plurality of chambers 120 $C_1$ through $C_N$ into which wafers $W_1$ and $W_2$ have been loaded. When the pressure within the plurality of chambers 120 $C_1$ through $C_N$ reaches a process pressure required for wafer treatment, the supercritical $CO_2$ flows through and escapes through the treatment space S within the plurality of chambers 120 $C_1$ through $C_N$. The pressure within the plurality of chambers 120 $C_1$ through $C_N$ is constantly maintained by the pressure regulators 272.

The wafer treatment begins by injecting a wafer treatment fluid, e.g., a mixture of supercritical $CO_2$ for etching or cleaning and cosolvent only into a first chamber $C_1$ of the plurality of chambers 120 $C_1$ through $C_N$. In this case, when the chucks 132 are spin chucks, the wafer treatment may be performed by rotating a wafer by the chucks 132 at a predetermined spin rate of 1 about to 2,000 rpm.

Once the wafer treatment is performed within the first chamber $C_1$ of the plurality of chambers 120 $C_1$ through $C_N$, the flow of the fluid into the first chamber $C_1$ of the plurality of chambers 120 $C_1$ through $C_N$ is blocked and the pressure of supercritical $CO_2$ is reduced by discharging the supercritical $CO_2$. Thereafter, both wafers $W_1$ and $W_2$ are unloaded from the first chamber $C_1$ of the plurality of chambers 120 $C_1$ through $C_N$.

After completing the wafer treatment within the first chamber $C_1$ of the plurality of chambers 120 $C_1$ through $C_N$, a wafer treatment begins by injecting a wafer treatment fluid, e.g., a mixture of supercritical $CO_2$ for etching or cleaning and cosolvent only into a second chamber $C_2$ of the plurality of chambers 120 $C_1$ through $C_N$. Thereafter, the same treatment as described above is sequentially performed within each of the remaining chambers of the plurality of chambers 120 $C_1$ through $C_N$, i.e., third to N-th chambers $C_3$ through $C_N$ of the plurality of chambers 120 $C_1$ through $C_N$, until the desired treatment is performed on all the wafers. After performing wafer treatment within the N-th chamber $C_N$ of the plurality of chambers 120 $C_1$ through $C_N$, the same process as described above is repeated for the first through N-th chambers $C_1$ through $C_N$ until a desired treatment is performed on all wafers to be treated therein.

Figure 5:
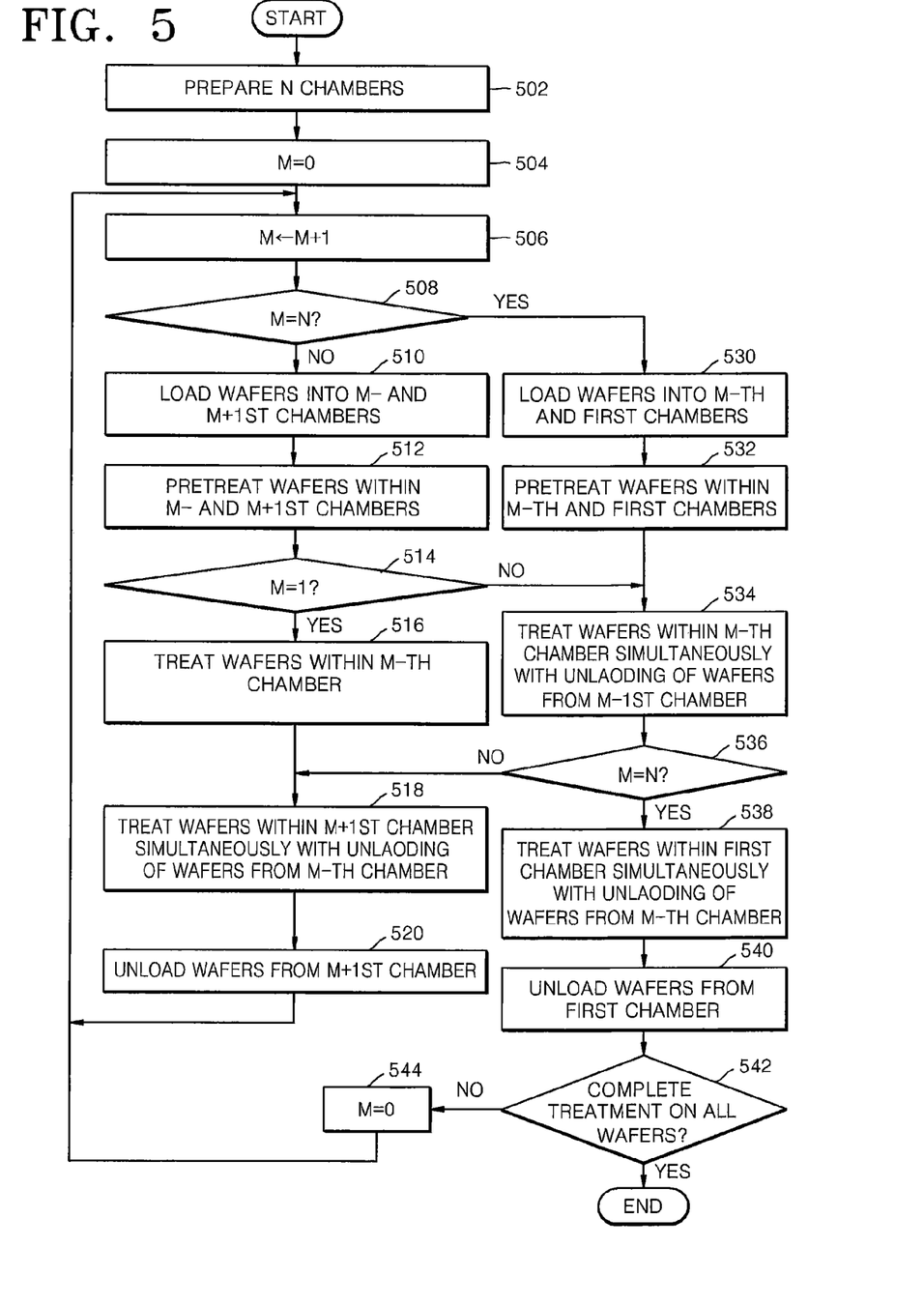
FIG. 5 is a flowchart illustrating a wafer treatment method according to an embodiment of the present invention.

FIG. 5 is a flowchart illustrating a wafer treatment method according to an embodiment of the present invention. However, it will be apparent that various changes and modifications may be made to operations illustrated in FIG. 5 without departing from the spirit and scope of the present invention.

In operation 502, the plurality of chambers 120 $C_1$ through $C_N$ that are connected to the plurality of first and second supply lines 230 and 240 for supplying the first fluid 212 in a supercritical state and a mixture of the first fluid 212 and second fluid 214 are prepared.

In operation 504, M is set to 0. In operation 506, M+1 is set to M. In operation 508, whether M=N is checked. If M=N, operation 530 is performed. If not, operation 510 is performed.

In operation 510, both wafers $W_1$ and $W_2$ are loaded into each of M- and M+1-st chambers $C_M$ and $C_{M+1}$ so that both wafers $W_1$ and $W_2$ are spaced apart by a predetermined distance. That is, a predetermined treatment space is formed between both wafers $W_1$ and $W_2$ within the chamber M- or M+1-st chambers $C_M$ or $C_{M+1}$. Both wafers $W_1$ and $W_2$ may be disposed with the front sides of both wafers $W_1$ and $W_2$ facing each other.

In operation 512, both wafers $W_1$ and $W_2$ may be pretreated within the M- and M+1-st chambers $C_M$ and $C_{M+1}$. For pre-treatment, only the first fluid 212 that is composed of supercritical $CO_2$ can be supplied to the M- and M+1-st chambers $C_M$ and $C_{M+1}$ through the first supply line 230. By performing the pre-treatment, the atmosphere within the M- and M+1st chambers $C_M$ and $C_{M+1}$ can be preset close to a wafer treatment atmosphere. The pretreatment operation 512 may be omitted if operation 512 is not essential to the entire process.

Thereafter, when M=1 in operation 514, operation 516 is performed. Otherwise, operation 534 is performed.

In operation 516, the desired treatment is performed on both wafers $W_1$ and $W_2$ loaded into the M-th chamber $C_M$. For example, a mixture of the first fluid 212 composed of supercritical $CO_2$ for etching or cleaning and the second fluid 214 composed of a cosolvent can be supplied to the M-th chamber $C_M$ through the second supply line 240 during the treatment. A treatment atmosphere within the M-th chamber $C_M$ can be maintained at a temperature of about 30 to 100° C. and a pressure of about 1,000 to 4,500 psi. Furthermore, both wafers $W_1$ and $W_2$ can be rotated at a spin rate of about 1 to 2,000 rpm as they are subjected to the treatment. Fluids necessary for the wafer treatment flow into and out of the M-th chamber $C_M$ at a flow rate of about 1 to 5,000 ml/min during the wafer treatment. The density of co-solvent contained in the mixture may be about 0.1 to 10 volume %, preferably, about 0.1 to 5 volume % based on the total volume of supercritical $CO_2$. The process time within the M-th chamber $C_M$ may be adjusted by the timer 262.

After performing the wafer treatment in operation 516, both wafers $W_1$ and $W_2$ are unloaded from the M-th chamber $C_M$ in operation 518. After completing treatment within the M-th chamber $C_M$, the desired treatment is successively performed on both wafers $W_1$ and $W_2$ that are loaded into the M+1-st chamber $C_{M+1}$. Wafer unloading is performed within the M-th chamber $C_M$ simultaneously with wafer treatment within the M+1-st chamber $C_{M+1}$. The treatment is performed within the M+1st chamber $C_{M+1}$ in the same manner as described in operation 516.

After completing the wafer treatment within the M+1st chamber $C_{M+1}$, both wafers $W_1$ and $W_2$ are unloaded from the M+1st chamber $C_{M+1}$. Then, the process returns to operation 506 to perform the same operations as described above.

If M=N in operation 508, i.e., wafer treatment is performed on the last one of the plurality of chambers 120 $C_1$ through $C_N$, both wafers $W_1$ and $W_2$ are loaded into the M-th chamber $C_N$ and the first chamber $C_1$ in operation 530.

In operation 532, a pretreatment is subsequently performed on the wafers within the M-th chamber $C_N$ and the first chamber $C_1$. The pretreatment can be performed in the same manner as described in operation 512 during or before wafer treatment on an M-1st chamber $C_{M-1}$ preceding the M-th chamber $C_N$.

In operation 534, after completing the wafer treatment within the M-1st chamber $C_{M-1}$, both wafers $W_1$ and $W_2$ are unloaded from the M-1st chamber $C_{M-1}$ at the same time as wafer treatment within the M-th chamber $C_N$. The wafer treatment is performed within the M-th chamber $C_N$ in the same manner as described in operation 516.

After completing the wafer treatment within the M-th chamber $C_N$, both wafers $W_1$ and $W_2$ are unloaded from the M-th chamber $C_N$. In this case, when the M-th chamber $C_N$ is the last one of the plurality of chambers 120 $C_1$ through $C_N$, the wafer treatment is performed within the first chamber $C_1$ at the same time as unloading of both wafers $W_1$ and $W_2$ from the M-th chamber $C_N$ in operation 538. The wafer treatment can be performed within the first chamber $C_1$ in the same way as described in operation 516.

In operation 540, both wafers $W_1$ and $W_2$ are subsequently unloaded from the first chamber $C_1$. After performing operation 534, when the M-th chamber $C_N$ is not the last one of the plurality of chambers 120 $C_1$ through $C_N$ in operation 536, the process returns to operation 518 in which wafer unloading is performed within the M-th chamber $C_M$ simultaneously with wafer treatment within the M+1st chamber $C_{M+1}$.

When there are remaining wafers to be treated, M is set to 0 in operation 544 and operations 506 through 542 are repeated. Once the desired wafer treatment has been performed on all the wafers that are to be treated, the wafer treatment process is terminated.

Figure 6:
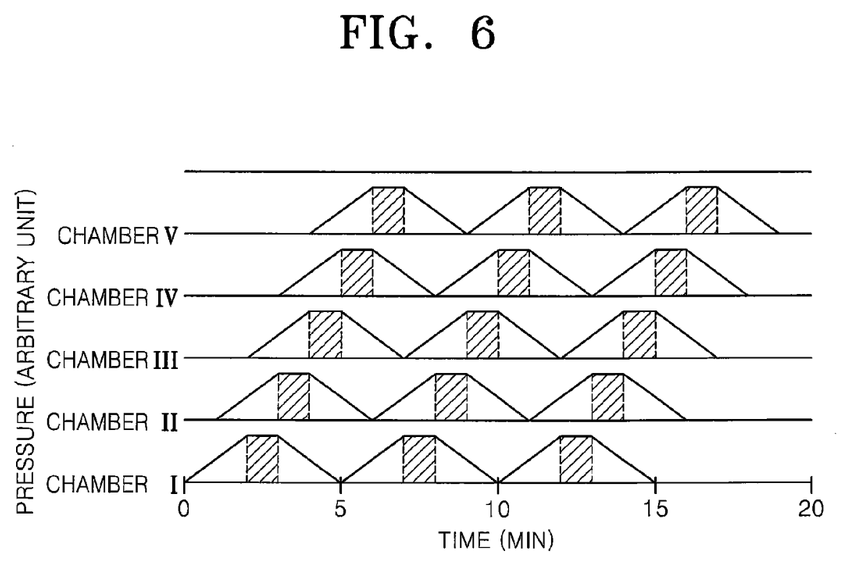
FIG. 6 is a graph illustrating a pressure profile with respect to time within each of the chambers when the wafer treatment time is set to 1 minute when performing a wafer treatment method according to an embodiment of the present invention.

FIG. 6 is a graph illustrating a pressure profile with respect to time within each of the five chambers I through V of the plurality of chambers 120 $C_1$ through $C_N$ when a wafer is treated for 1 minute using a wafer treatment apparatus including the five chambers I through V of the plurality of chambers 120 $C_1$ through $C_N$ according to the present invention. The graph is intended to explain a wafer treatment method according to an embodiment of the present invention.

Figure 7:
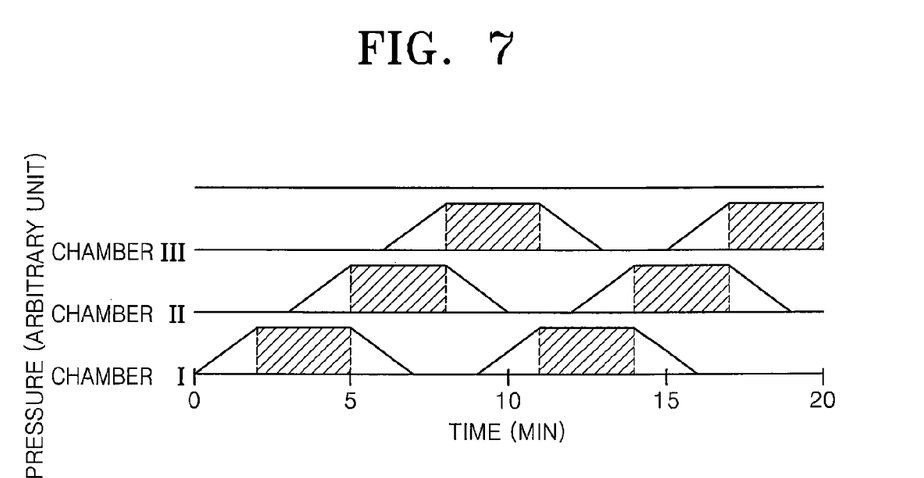
FIG. 7 is a graph illustrating a pressure profile with respect to time within each of the chambers when the wafer treatment time is set to 3 minutes when performing a wafer treatment method according to another embodiment of the present invention.
Figure 8:
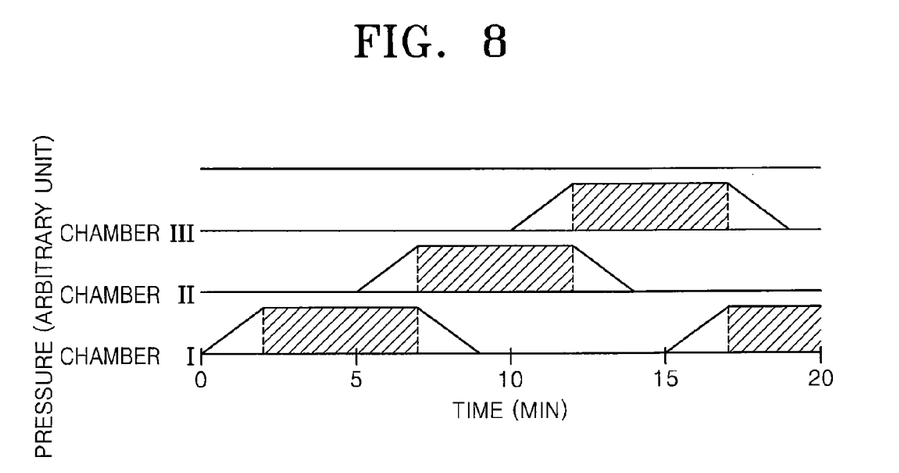
FIG. 8 is a graph illustrating a pressure profile with respect to time within each of the chambers when the wafer treatment time is set to 5 minutes when performing a wafer treatment method according to another embodiment of the present invention.

FIGS. 7 and 8 are graphs respectively illustrating a pressure profile with respect to time within each of three chambers I through III of the plurality of chambers 120 $C_1$ through $C_N$ when a wafer is treated for 3 and 5 minutes using a wafer treatment apparatus including the three chambers I through III of the plurality of chambers 120 $C_1$ through $C_N$ in order to explain the wafer treatment method, according to another embodiments of the present invention.

The wafer treatments in operations 516, 518, 534, and 538 as illustrated in FIG. 5 corresponds to the time during which a predetermined pressure is maintained, i.e., portions indicated by oblique lines. In order to create an atmosphere for wafer treatment such as etching, cleaning, or drying after wafers are loaded into a chamber of the plurality of chambers 120 $C_1$ through $C_N$ before wafer treatment on each wafer of the plurality of chambers 120 $C_1$ through $C_N$, pressure boost time is required to increase the pressure within the chamber of the plurality of chambers 120 $C_1$ through $C_N$. The pressure boost time may include the time for pretreatment performed on a wafer in operations 512 and 532 of FIG. 5. Furthermore, after completing a predetermined treatment on wafers loaded into a chamber of the plurality of chambers 120 $C_1$ through $C_N$, pressure reduction time is required to reduce the pressure within the chamber for unloading of the wafers from the chamber.

The pressure boost time and pressure reduction time required before and after the wafer treatment processes in FIGS. 6-8 are set to 2 minutes, respectively.

FIGS. 5 through 8 show that a predetermined treatment such as etching, cleaning or drying is performed on wafers within only one of the plurality of chambers 120 $C_1$ through $C_N$, followed by wafer treatment on the succeeding chamber. That is, wafer treatment is sequentially performed within each of the plurality of chambers 120 $C_1$ through $C_N$. Thus, additional time for pressure boost or reduction is not needed until wafer treatment is performed on all wafers within the plurality of chambers 120 $C_1$ through $C_N$. That is, the process time includes only time required for one pressure boost performed before treatment on the first wafer and time required for one pressure reduction after treatment on the last wafer. Thus, a wafer treatment method according to the present invention can reduce the amount of time required to treat a plurality of wafers as compared to a wafer treatment method using a single-wafer chamber.

As described above, a wafer treatment apparatus according to the present invention includes a plurality of chucks within a plurality of chambers to enable simultaneous treatment of a plurality of wafers. The wafer treatment apparatus also includes a controller for controlling the loading/unloading of wafers in the wafer treating unit as well as the open/closed state of valves installed on fluid supply lines connected to each of the plurality of chambers. A wafer treatment method according to the present invention that can be performed using the wafer treatment apparatus involves performing a predetermined treatment such as etching, cleaning or drying on wafers within only one of the plurality of chambers, followed by wafer treatment on the succeeding chamber, and thus allowing for sequential wafer treatment within each of the plurality of chambers. Thus, the wafer treatment method of the present invention does not require additional time for pressure boost or reduction during a period of time when wafer treatment is performed on all wafers within the plurality of chambers. The wafer treatment method of the present invention also allows simultaneous treatment of at least two wafers loaded into a single chamber of the plurality of chambers, and thus increasing the process throughput. Thus, the present invention can reduce the amount of time required to treat a plurality of wafers using a supercritical fluid, and thus increasing productivity. The present invention also enables sequential wafer treatment within each of the plurality of chambers, and thus improving uniformity across treated wafers.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A wafer treatment apparatus comprising:
a wafer treating unit including a chamber; and
a fluid supply unit including a first supply that supplies a fluid in a supercritical state to the chamber,
wherein the chamber comprises a pair of cases having an upper case and a lower case configured to mutually fit to define a treatment space for treating a wafer, and a holder for supporting the wafer within the treatment space, the holder being fixed to the upper case and being configured to support the wafer so that a front side of the wafer is faced with the lower case with the treatment space between the front side of the wafer and the lower case.

2. The apparatus of claim 1, wherein the fluid comprises supercritical $CO_2$.

3. The apparatus, of claim 1, further comprising a separator configured to separate a supercritical fluid from a fluid escaping from the chamber.

4. The apparatus of claim 3, further comprising a recycle filter configured to filter out the supercritical fluid obtained by the separator and feed the supercritical fluid back to the first supply.

5. The apparatus of claim 3, further comprising an exhaust line disposed between the chamber and the separator at the downstream of the wafer treating unit.

6. The apparatus of claim 5, further comprising a check valve installed on the exhaust line, the check valve being configured to control the flow of a fluid through the exhaust line.

7. The apparatus of claim 1, further comprising a timer disposed near the chamber, the timer being configured to control the time fir wafer treatment within the chamber.

8. The apparatus of claim 1, further comprising a pressure adjusting element disposed near the chamber, the pressure adjusting element being configured to control the pressure within the chamber.

9. The apparatus of claim 1, wherein the pair of cases comprise hastelloy or monel metal.

10. The apparatus of claim 1, wherein the first supply comprises:
a bombe that supplies the fluid in a liquid state at a first pressure; and
a condenser that compresses the fluid supplied from the bombe at a second pressure higher than the first pressure to create a supercritical fluid.

11. The apparatus of claim 10, wherein the first supply further comprises a booster pump that is disposed between the condenser and the wafer treating unit and that increases the pressure of the fluid escaping from the condenser.

12. The apparatus of claim 1, further comprising:
a supply line connected between the first supply and the chamber and feeds the fluid from the first supply into the chamber;
a valve disposed on the supply line, the valve being configured to allow or block flow of the fluid through the supply line; and
a controller configured to control the open closed state of the valve.

13. The apparatus of claim 1, wherein the upper case and the lower case are configured to mutually fit to open and close in order to define the treatment space.

14. The apparatus of the claim 1, further comprising a housing for encapsulating the pair of cases.

15. A wafer treatment apparatus comprising:
a wafer treating unit including a plurality of chambers;
a fluid supply unit including a first supply that supplies a fluid in a supercritical state to a selected chamber from the plurality of chambers; and
a loadlock for loading/unloading a wafer into/from the selected chamber,
wherein at least one chamber of the plurality of chambers comprises a pair of cases having an upper case and a lower case configured to mutually fit to define a treatment space for treating the wafer, and a holder for supporting the wafer within the treatment space, the holder being fixed to the upper case and being configured to support the wafer so that a front side of the wafer is faced with the lower case with the treatment space between the front side of the wafer and the lower case.

16. The apparatus of claim 15, wherein the first supply comprises:
   a bombe that supplies the fluid in a liquid state at a first pressure; and
   a condenser that compresses the fluid supplied from the bombe at a second pressure higher than the first pressure to create a supercritical fluid.

17. The apparatus of claim 15, further comprising a separator configured to separate a supercritical fluid from a fluid escaping from the plurality of chambers.

18. The apparatus of claim 17, further comprising a recycle filter configured to filter out the supercritical fluid obtained by the separator and feed the supercritical fluid back, to the first supply.

19. The apparatus, of claim 15, wherein the upper case and the lower case are configured to mutually fit to open and close in order to define the treatment space.

* * * * *